United States Patent
Ilkov et al.

(10) Patent No.: US 7,495,525 B2
(45) Date of Patent: Feb. 24, 2009

(54) MULTILAYER PLANAR BALUN TRANSFORMER, MIXERS AND AMPLIFIERS

(75) Inventors: Nikolay Ilkov, Teltow (DE); Vaseem Ahmed, Hasbrouck Heights, NJ (US); Vasyl Dykyy, Teltow (DE)

(73) Assignee: Synergy Microwave Corporation, Paterson, NJ (US)

( * ) Notice: Subject to any disclaimer, the term of this patent is extended or adjusted under 35 U.S.C. 154(b) by 248 days.

(21) Appl. No.: 11/507,868

(22) Filed: Aug. 22, 2006

(65) Prior Publication Data
US 2007/0057745 A1 Mar. 15, 2007

Related U.S. Application Data

(60) Provisional application No. 60/710,570, filed on Aug. 23, 2005.

(51) Int. Cl.
*H03H 5/00* (2006.01)
(52) U.S. Cl. .......................................... 333/26; 336/200
(58) Field of Classification Search .................. 333/25, 333/26; 336/200
See application file for complete search history.

(56) References Cited

U.S. PATENT DOCUMENTS

| | | | |
|---|---|---|---|
| 2,470,307 A | 5/1949 | Guanella | |
| 4,193,048 A | 3/1980 | Nyhus | |
| 5,061,910 A | 10/1991 | Bouny et al. | |
| 5,644,272 A | 7/1997 | Dabrowski et al. | |
| 5,697,088 A | 12/1997 | Gu | |
| 5,745,017 A | 4/1998 | Ralph | |
| 5,808,518 A | 9/1998 | McKinzie, III et al. | |
| 5,949,299 A * | 9/1999 | Harada | 333/25 |
| 6,294,965 B1 | 9/2001 | Merrill et al. | |
| 6,396,362 B1 * | 5/2002 | Mourant et al. | 333/25 |
| 6,603,383 B2 * | 8/2003 | Gevorgian et al. | 336/200 |

FOREIGN PATENT DOCUMENTS

| | | |
|---|---|---|
| DE | 14 66 505 | 12/1977 |
| EP | 0 419 756 | 4/1991 |
| JP | 03-046804 | 2/1991 |
| WO | WO-97/48187 | 12/1997 |
| WO | WO-01/80349 | 10/2001 |
| WO | WO-02/052590 | 7/2002 |

OTHER PUBLICATIONS

Dong et al., "Analyzing 4:1 TLTs For Optical Receivers—Transmissions-line transformers can provide reliable interfaces between different impedances for broadband applications in RF, wireless, and optical systems.", Microwaves&RF, Mar. 2005.
Trask, "A Tutorial on Transmission Line Transformers", Aug. 14, 2005, Sonoran Radio Research, pp. 1-7.

* cited by examiner

*Primary Examiner*—Don P Le
(74) *Attorney, Agent, or Firm*—Lerner, David, Littenberg, Krumholz & Mentlik, LLP

(57) ABSTRACT

A surface mountable transformer integratable into a printed circuit board. In one aspect, the transformer comprises two broadside vertically coupled transmission lines. In another aspect, the transformer may comprise two broadside vertically partially coupled transmission lines. The layout of the transformer is adaptable for use in microwave modules where transformers are integrated into the printed circuit board and the active components are mounted in the cavity. The layout preferably requires only two signal areas. In addition, an aspect of the present invention allows the differential or unbalanced ports to lie on the same surface as the balanced port.

15 Claims, 9 Drawing Sheets

MULTILAYER PLANAR BALUN TRANSFORMER, MIXERS AND AMPLIFIERS

CROSS-REFERENCE TO RELATED APPLICATIONS

This application claims the benefit of the filing date of U.S. Provisional Patent Application No. 60/710,570, filed Aug. 23, 2005, the disclosure of which is hereby incorporated herein by reference.

BACKGROUND OF THE INVENTION

This invention generally relates to balun transformers that may be implemented on a printed circuit board or in surface mount packages, and more particularly to a transformer layout suitably adaptable for use in microwave modules where the transformer is integrated in the printed circuit board.

A balun is a device designed to convert between balanced and unbalanced electrical signals, such as between, for example, a coaxial cable and a ladder line. Baluns may be considered as simple forms of transmission line transformers. The seminal work on transmission line transformers was done by Gustav Guanella in 1944. Guanella's transformer is described in U.S. Pat. No. 2,470,307. Guanella proposed coiling transmission lines to form a choke that would suppress the undesired mode in balanced-to-unbalanced matching applications. Guanella's transformer comprised a basic building block or a 1:1 balun. As is generally known, the choking reactance of Guanella's transformer isolates the input from the output. That reactance is usually obtained by coiling the transmission line around a ferrite core or by threading the line through ferrite beads. In general, the objectives are to have the characteristic impedance, $Z_0$, of the transmission line equal to the value of the load $R_L$, which is generally referred to as the optimum characteristic impedance, and to have the choking reactance much greater than $R_L$ (and hence $Z_0$). By combining coil transmission lines in parallel-series arrangements, Guanella was able to demonstrate very broad baluns, with ratios of $1:n^2$ where n is the number of transmission lines. FIG. 1A shows a schematic for Guanella's 1:4 balun.

Baluns may be implemented in a variety of ways using different types of transmission line elements. For example, coaxial transmission line segments can be used to form baluns at relatively low frequencies. These types of baluns are, however, difficult to integrate with other elements of microwave circuits where surface mount design techniques are used. Where such techniques are employed, baluns may be formed on printed circuit boards. Such baluns may be fabricated from stripline or other conductor materials that is formed on a substrate of a printed circuit board in a known manner. In addition to stripline, microstripline or other technologies have been used to form the conductive traces. In general, surface mount designs require that components or devices are mounted on a printed circuit board having printed circuit traces on at least one surface of the board. The surface mount components connect to the terminals of the traces using known soldering techniques.

Turning now to FIG. 1B, there is shown a schematic circuit diagram of a prior art transformer. Due to the asymmetry cased by grounding at port 5, it is typically necessary for this balun transformer to function at the junction point where L1 is tapped. This point does not always have a zero potential for the differential signal. This usually leads to degradation in performance. The transformer of FIG. 1B is commonly used in diode double-balanced mixers normally followed by a Guanella balun transformer. U.S. Pat. No. 6,294,965 to Merrill et al. modifies the transformer of FIG. 1B but the summing function needed for mixers and to establish a DC supply point is not provided.

FIG. 1C shows a equivalent schematic circuit diagram of the transformer described in the '965 patent.

In surface mount applications it is desirable to have the various circuit elements and conductive traces desirably shaped to meet design demands. The present invention provides a balun transformer that may be implemented on a printed circuit board so as to advantageously allow more flexibility in the layout of the circuit elements.

SUMMARY OF THE INVENTION

An aspect of the present invention is a surface mountable balun transformer that is preferably integratable into a printed circuit board. The transformer preferably comprises a first C-shaped line segment having a first end and a second end disposed on the layer of the printed circuit board and a second C-shaped line segment having a first end and a second end disposed on a layer of the printed circuit board. Further in accordance with this aspect of the present invention, the first ends of each of the C-shaped line segments preferably provide a balanced port for connecting to the transformer and the second end of the first C-shaped line segments preferably provides an unbalanced port for connecting to the transformer.

Further in accordance with this aspect of the present invention, the surface mountable balun transformer may further comprise a third C-shaped line segment broadside vertically coupled to the first C-shaped line segment. In addition, the surface mountable balun transformer may further desirably comprise a fourth C-shaped line segment broadside vertically coupled to the second C-shaped line segment.

Further in accordance with this aspect of the present invention, the third and fourth C-shaped line segments are preferably separated form the first and second C-shaped line segments by a dielectric material.

Further still, this aspect of the present invention may further comprise third and fourth C-shaped line segments broadside vertically partially respectively coupled to the first and second C-shaped line segments.

Further in accordance with this aspect of the present invention, the balanced port of the surface mountable balun transformer is desirably disposed opposite the unbalanced port on the layer of the printed circuit board.

In addition, this aspect of the present invention may further desirably comprise a first port formed by a metallized via hole that couples the balun transformer to the power plane of the printed circuit.

Further still in accordance with this aspect of the present invention, each of the C-shaped line segments may be desirably folded to form a pair of U-shaped sections that are connected in series.

In addition, the balun transformer may further comprise a first port formed by a metallized via that extends between the layers of the printed circuit board and wherein the first port is located adjacent the balanced port and connected to the second end of the second line segment and is shorted to a ground through the metallized via.

In another aspect, the present invention may comprise a printed circuit board. The printed circuit board preferably comprises a first planar layer and a second planar layer disposed opposite and parallel to the first planar layer; a first C-shaped line segment having a first end and a second end disposed on the first planar layer of the printed circuit board;

and a second C-shaped line segment broadside vertically coupled to the first C-shaped line segment, the second C-shaped line segment having a first end and a second end disposed on a second planar layer of the printed circuit board. The printed circuit board also preferably includes a third C-shaped line segment having a first end and a second end disposed on the first planar layer of the printed circuit board; a fourth C-shaped line segment broadside vertically coupled to the third C-shaped line segment, the fourth C-shaped line segment having a first end and a second end disposed on the second planar layer of the printed circuit board; and a fifth line segment having an end connecting the second ends of the first and third line segments and another end forming an unbalanced port. Further in accordance with this aspect of the present invention, the first ends of the first and third line segments preferably form a balanced port and the first end of the second line segment preferably forms an unbalanced port.

In accordance with this aspect of the present invention each of the C-shaped line segments are preferably folded to form a pair of U-shaped sections that are connected in series.

In addition, the second end of the second line segment is desirably connected to ground on the second layer of the board through a metallized via.

In another aspect, the present invention comprises a printed circuit board that preferably comprises a first planar layer and a second planar disposed opposite and parallel to the first planar layer; an electronic circuit disposed within a cavity formed within the first planar layer; a first balun transformer having a pair of C-shaped broadside vertically coupled lines connected in series so as to form a first unbalanced port on the first planar layer and a first balanced port on the first planar opposite the unbalanced port; and a second balun transformer having a pair of C-shaped broadside vertically coupled lines connected in series so as to form a second unbalanced port on the first planar layer and a second balanced port on the first planar layer opposite the second unbalanced port. In accordance with this aspect with the present invention, first and second unbalanced ports are desirably connected to the electronic circuit.

In accordance with this aspect of the present invention, the electronic circuit may desirably comprise a diode ring, mixer or a power amplifier.

DETAILED DESCRIPTION

Figure 1A:
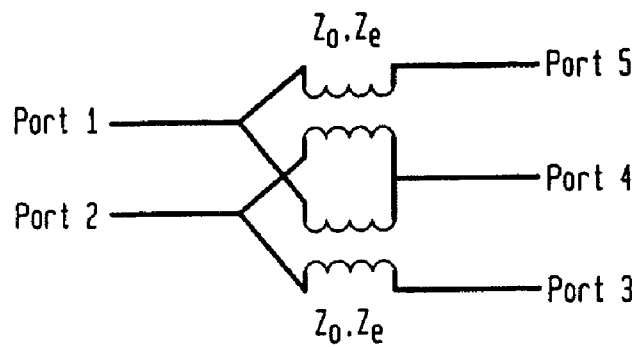
FIG. 1A is a schematic circuit diagram of a prior art Guanella 1:4 impedance transformer.
Figure 1B:
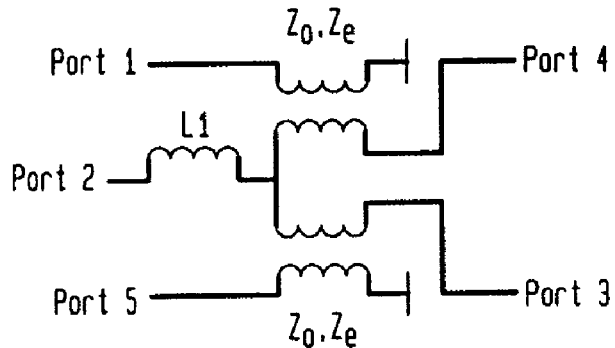
FIG. 1B depicts a schematic of a prior art transformer used in a double balanced mixer.
Figure 1C:
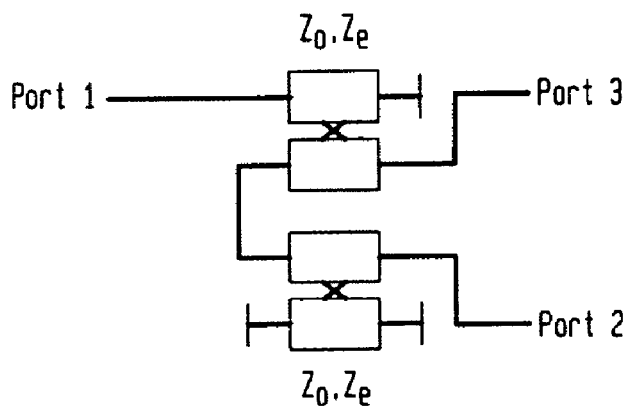
FIG. 1C illustratively depicts a schematic of a prior art balun transformer.
Figure 2:
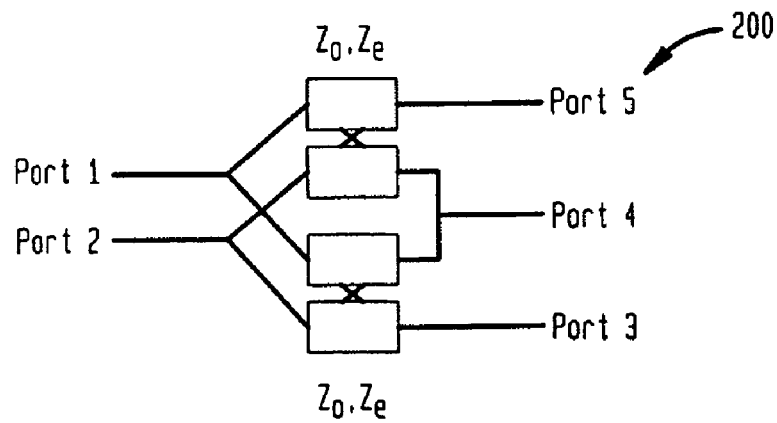
FIG. 2 illustratively depicts an equivalent schematic circuit diagram of a balun transformer in accordance with an aspect of the present invention.

Turning now to FIG. 2, there is shown an equivalent schematic circuit diagram of a balun transformer 200 in accordance with an aspect of the present invention. The transformer 200 includes five ports labeled ports 1, 2, 3, 4 and 5. The transformation ratio is denoted by $Z_{load}$ and is given by the following equation:

$$Z_{load} = \frac{4Zo^2}{Z_{source}} \quad (1)$$

$$\text{where } Zo = \sqrt{Z_{o_{odd}} * Z_{o_{even}}}$$

The above transformation ratio is for frequencies where the coupler length is equal to a quarter wavelength. $Z_0$ is a characteristic impedance and $Z_{0_{odd}}$ and $Z_{0_{even}}$ are the odd and even mode impedances of the lines, respectively. In accordance with this aspect of the present invention, when port 2 is grounded, the structure desirably operates as an impedance-transforming balun with port 1 as a single-ended or unbalanced port and ports 3 and 5 as a differential or balanced port. As is explained in further detail below, when operating as a balun transformer ports 2 and 4 are preferably grounded.

Figure 3:
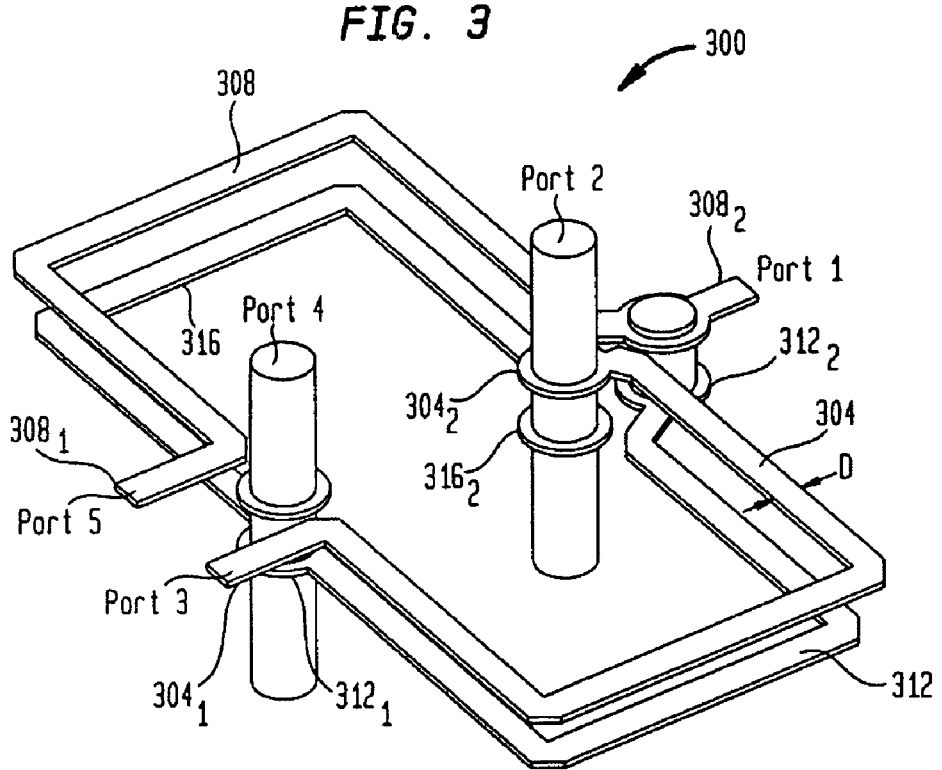
FIG. 3 illustratively depicts a perspective side view of a layout of a balun transformer in accordance with an aspect of the present invention.

Turning now to FIG. 3, there is shown a layout of a surface mountable balun transformer 300 in accordance with an aspect of the present invention. The transformer 300 is advantageously adapted for use in microwave modules circuits where the transformers are integrated in the printed circuit board and the active devices or components are mounted in a cavity. The transformer 300 includes four lines segments 304, 308, 312 and 316. Each of the line segments forms a trace on a printed circuit board. Each trace may comprise a stripline or microstripline. Striplines or microstriplines are transmission lines which can be formed as a conductive metal trace based in a dielectric media with two parallel ground planes on both sides balun dielectric surface. For clarity, the dielectric media or substrate is not shown in FIG. 3, but can be readily appreciated as comprising a multilayer structure which allows line segments 304 and 308 to be placed on a first surface of the dielectric substrate and line segments 312 and 316 to be placed on an opposed second surface of the dielectric substrate. In addition, the dielectric substrate frequently includes two parallel ground planes on both surfaces of the substrate. Preferably, the layer of conductive material comprises copper and the dielectric substrate preferably comprises a low loss high frequency laminate or an equivalent thereof. The impedance of the line segments is determined by the dimension of the segments, and the type of dielectric material that is used. As is known to those skilled in the art, the selection of the dielectric material and the sizing of the line segments may be chosen to meet the particular design requirements and/or constraints.

In addition, a coupled line segment is generally known as a structure that comprises two lines having a constant distance between them. In a multi-layer structure, such as depicted in FIG. 3, the coupled line segments may be made as two parallel traces on the same layer with ground planes on the layers above and below the layer with the traces, or as parallel traces placed on two adjacent layers. As is discussed in further detail below, the printed circuit board may include other surface mounted components which can be electrically connected to the ports of the balun transformer 300.

As is shown in FIG. 3, the first line segment 304 includes a first end $304_1$, which forms port 3. The first line segment 304 also includes a second end $304_2$, which is connected to port 2. Note that although port 2 is depicted as a separate cylindrical block, it is preferably formed as a via. This is also the case for port 4 and any other similarly depicted element herein. The line segment 308 includes a first end $308_1$ and a second end $308_2$. As shown, the first end $308_1$ forms port 5 while the second end $308_2$ forms port 1.

Each of the line segments include a broadside that is defined by the lateral dimension D of the trace on the substrate. Although in the preferred embodiment, each of the line segments depicted in FIG. 3 may comprise the same lateral dimension D, the invention is not so limited. As is known in the art, the dimensions may be varied, particularly the traces that are located on opposed vertical surfaces, to meet the design requirements.

As mentioned above, each of the ports 2 and 4 are preferably formed by a via or via-hole. In the preferred embodiment, each of these ports are connected by the via to the power planes of the printed circuit board on which the line segments are traced. In addition, in the preferred embodiment both of these ports are shorted to ground. As is shown in FIG. 3, the first and second ends of line segment 316, i.e., ends $316_1$ and $316_2$, are connected to the vias forming ports 2 and 4. In addition, the first end $312_1$ of the line segment 312 is connected to port 4. The second line segment $312_2$ is also connected to a via.

In accordance with an aspect of the present invention, each of the line segments 304, 308, 312 and 316 comprise C-shaped line segments or conductive traces on a surface of the printed circuit board. In a multilayer structure, these line segments or conductive traces may also be located in the printed circuit board. As is also shown in FIG. 3, the line segments 304 and 312 comprise broadside coupled lines. In addition, the line segments 308 and 316 similarly comprise broadside coupled line segments or transmission lines. Further, the first ends of the line segments $308_1$ and $304_1$ comprise the differential or balanced port of the transformer 300. The second end $308_2$ of the line segment 308 forms the unbalanced port of the transformer 300. In accordance with an aspect of the present invention, both the balanced and unbalanced ports lie in the same plane or on the same surface of the printed circuit board onto which the transformer 300 is fabricated. In this regard, having the differential or balanced output on a single layer makes it possible to directly interface active components mounted in a cavity on the printed circuit board. In addition, in accordance with this aspect of the present invention, the layout requires only two signal layers. Furthermore, if the transmission lines are partially coupled, higher-mode impedances can be achieve, thereby keeping the ohmic losses and the occupied area small. When built using standard printed circuit board technology, the transformer 300 is desirable for use in applications comprising of a frequency range between 0.1 to 20 GHz. Although we found that a trace width of approximately 0.08 inches (8 mils) can be used to implement the circuitry and layouts described herein, the width of the trace depends on the thickness of the substrate material.

Figure 4:
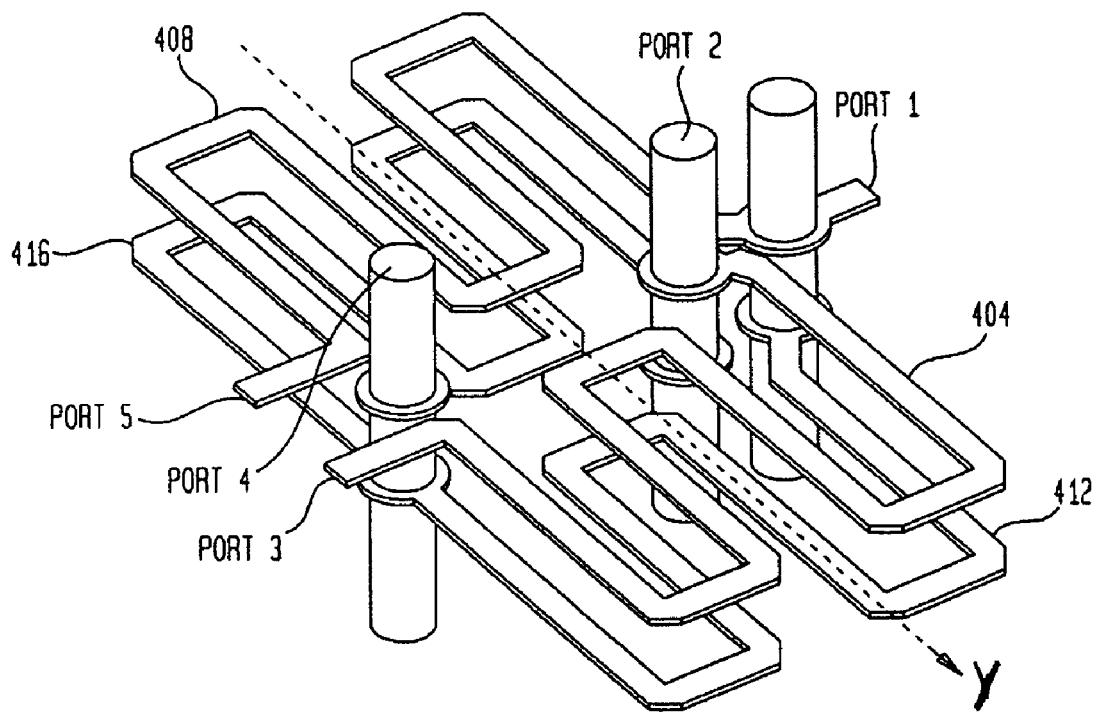
FIG. 4 illustratively depicts a perspective side view of a layout of a balun transformer in accordance with an aspect of the present invention.

Turning now to FIG. 4, there is shown a surface mountable balun transformer 400 in accordance with an additional aspect of the present invention. Functionally, the transformer 400 operates similarly to the transformer 300 of FIG. 3. However, the line segments that comprise the coupled transmission lines are shaped differently. They are folded. In particular, each of the line segments 404, 408, 412 and 416 are formed as pairs of U-shaped traces connected in series and symmetrical about the y-axis. The layout of FIG. 4 advantageously allows for better area utilization on the printed circuit board and allows for greater flexibility, which is generally desirable where compactness is of importance. As previously discussed in relation to FIG. 3, ports 3 and 5 comprise the balanced ports for connecting or coupling a signal to the transformer 400. Port 1 comprises the unbalanced port connecting to the transformer. Ports 2 and 4 preferably comprise vias that are connected to the board's power planes and are preferably grounded.

Figure 5:
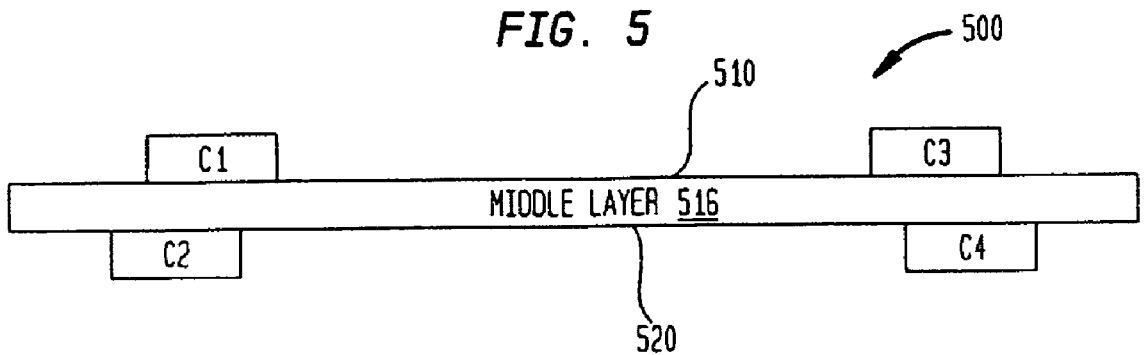
FIG. 5 illustratively depicts a side view of a layout of a balun transformer in accordance with an aspect of the present invention.

Turning now to FIG. 5, there is shown a side view of a printed circuit board 500 in accordance with a further aspect of the present invention. As shown in FIG. 5, the board 500 includes a first surface layer 510, a middle layer 516 and a second surface layer 520. The first and second surface layers 510, 520 comprise planar surfaces that extend substantially parallel to one another. The middle layer 516 separating these two surface layers preferably comprises a dielectric. Each of the blocks C1, C2, C3 and C4 illustratively depict a line segment or trace on the surfaces shown. These traces may comprise C-shaped or the folded shape of FIG. 4 in accordance with the foregoing description. Line segments C1 and C2 comprise broadside vertically partially coupled transmission lines. Line segments C3 and C4 likewise comprise broadside vertically partially coupled transmission lines. As discussed above, by vertically partially coupling the transmission lines along their broadside, higher mode impedance may be achieved while keeping the ohmic losses low. Note, however, the coupled lines may also comprise broadside vertically fully coupled transmission lines by aligning C1 directly above C2 and C3 directly above C4.

In accordance with the foregoing description, an aspect of the present invention is a printed line structure preferably comprising at least two C-shaped broadside coupled lines connected in series at one side so that ports 3 and 5 differentially exit the structure. In addition, port 4 is preferably formed by a via that can be connected directly to the board's power planes or can be used to tap a common mode signal. Further, the lines are connected in parallel so that port 1 exits on the opposite side of the structure and port 2 is formed by a via that can also be connected directly to the board's power planes. In accordance with this aspect of the present invention, ports 5 and 3 are taken directly from the couplers, port 4 is the junction point of both C-shaped couplers and ports 1 and 2 are taken through metallized via holes. Further in accordance with this aspect of the present invention, the transmission lines may be folded as is shown in FIG. 4. Furthermore, where the coupled lines are broadside vertically partially coupled transmission lines as shown in FIG. 5, higher odd-mode impedance may be achieve while keeping the ohmic losses low. In addition, the coupled lines may be broadside vertically fully coupled transmission lines.

Figure 6:
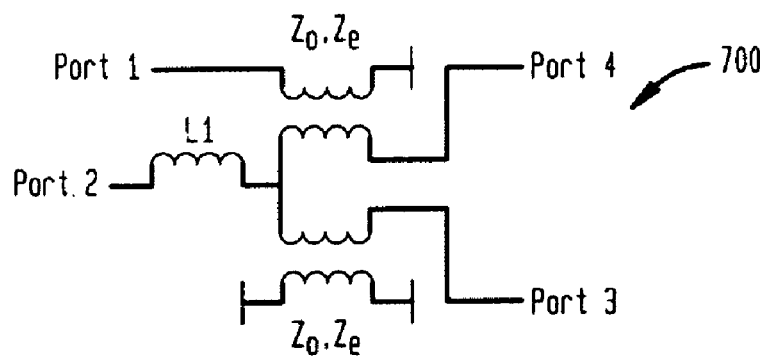
FIG. 6 illustratively depicts a schematic of a transformer in accordance with an aspect of the present invention.

FIG. 6 illustratively depicts a schematic circuit diagram of a transformer 700 in accordance with another aspect of the present invention. In accordance with FIG. 6, a differential signal between ports 3 and 4 is transformed to a single ended signal at port 1 with an impedance transformation $Z_1$. $Z_1$ is given by the following equation:

$$Z_1 = \frac{Z_0^2}{Z_{34}} \quad (2)$$

Figure 7:
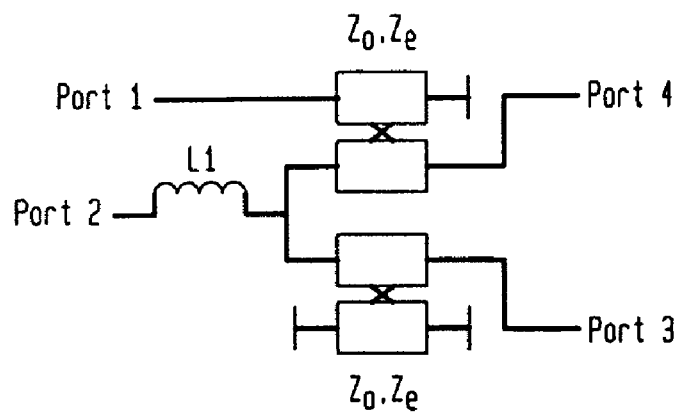
FIG. 7 illustratively depicts an equivalent schematic of FIG. 6 in accordance with an aspect of the present invention.

$Z_0$ is equal to the square root of $Z_{O_{odd}} * Z_{O_{even}}$ as indicated above for frequencies where the coupler length is equal to a quarter wavelength. A common mode signal on ports 3 and 4 is transformed as a single ended signal at port 2. The inductive element L1 is provided to improve the high frequency performance of the differential single ended (balun) transformation. L1 may comprise a portion of the transmission line. Port 2 may also be used for supplying a DC current to the circuit without the need for additional components. In accordance with a further aspect of the present invention, a printed circuit board layout in accordance with FIG. 6 desirably allows a transformer to provide a differential to the single ended conversion by grounding one of the ports. FIG. 7 is an equivalent schematic circuit diagram of the transformer of FIG. 6.

Figure 8:
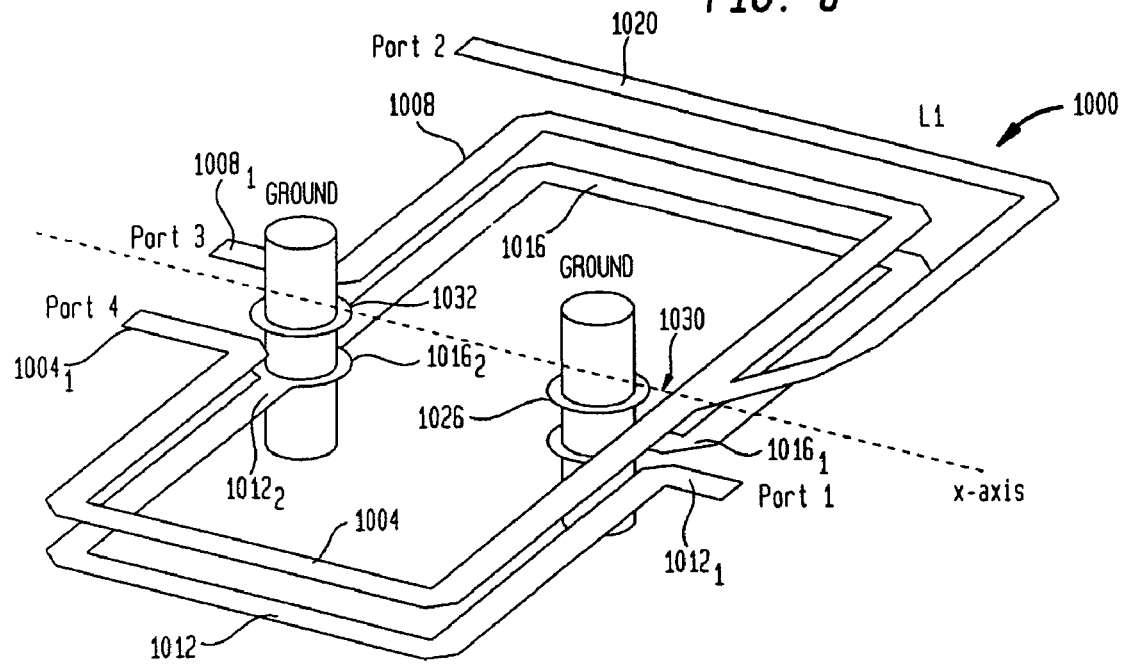
FIG. 8 illustratively depicts a perspective side view of a layout of a balun transformer in accordance with an aspect of the present invention.

FIG. 8 illustratively depicts a layout of a surface mountable balun transformer 1000 in accordance with an aspect of the present invention. The transformer 1000 includes four ports labeled as ports 1, 2, 3 and 4. The transformer 1000 includes five line segments 1004, 1008, 1012, 1016 and 1020. The line segments 1004, 1008 are disposed on a first layer of a substrate (not shown) of a printed circuit board. Each of these line segments 1004, 1008 includes first ends $1004_1$, $1008_1$, respectively. Each of these first ends comprises the balanced ports, port 3, port 4, of the transformer 1000. The line segments 1004, 1008 would form two C-shaped traces in a plane above the x-axis except that they are joined at what would comprise their other end. That other end which is located near via 1026 is illustratively depicted using arrow 1030.

The fifth line segment 1020 extends from approximately location 1030 running parallel and adjacent to two sections of line segment 1008 as shown. The line segment 1020 comprises the inductor L1 shown in FIGS. 6 and 7.

As also shown, line segment 1012 include a first end $1012_1$ and a second end $1012_2$. Line segment 1012 is disposed in a plane on a second surface that extends parallel to the first surface of the substrate. Together, line segments 1004 and 1012 comprise broadside vertically coupled transmission lines. In a similar fashion, line segments 1008 and 1016 comprise broadside vertically coupled transmission lines. In addition, line segment 1016 includes a first end $1016_1$ and a second end $1016_2$. The first end $1016_1$ terminates on the grounding via 1026. The second end $1016_2$ terminates on the grounding via 1032 along with second end $1012_2$. We conveniently refer to the transformer 1000 as comprising a 0/180 four port network or a microwave hybrid layout.

Figure 9:
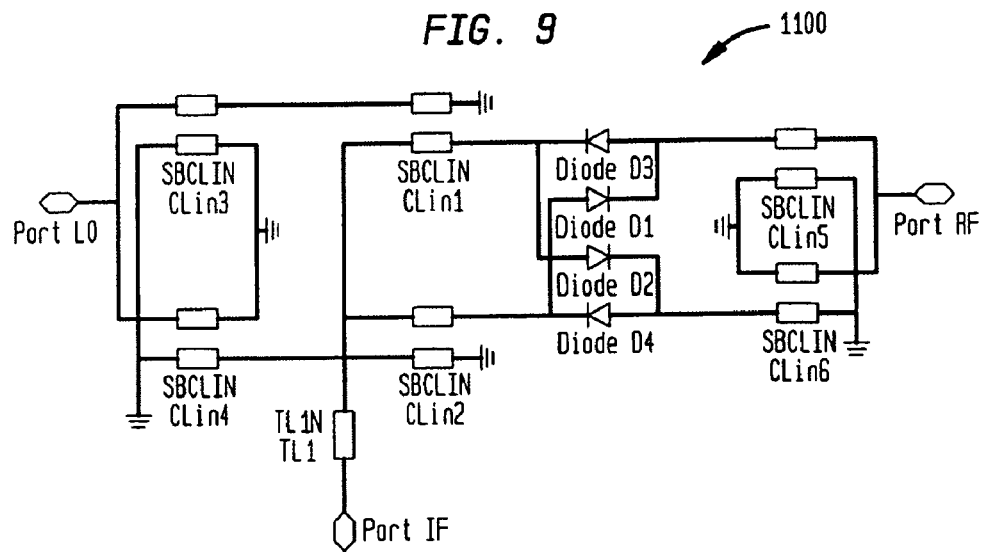
FIG. 9 illustratively depicts a circuit diagram of a double balanced diode mixer in accordance with an aspect of the present invention.
Figure 10:
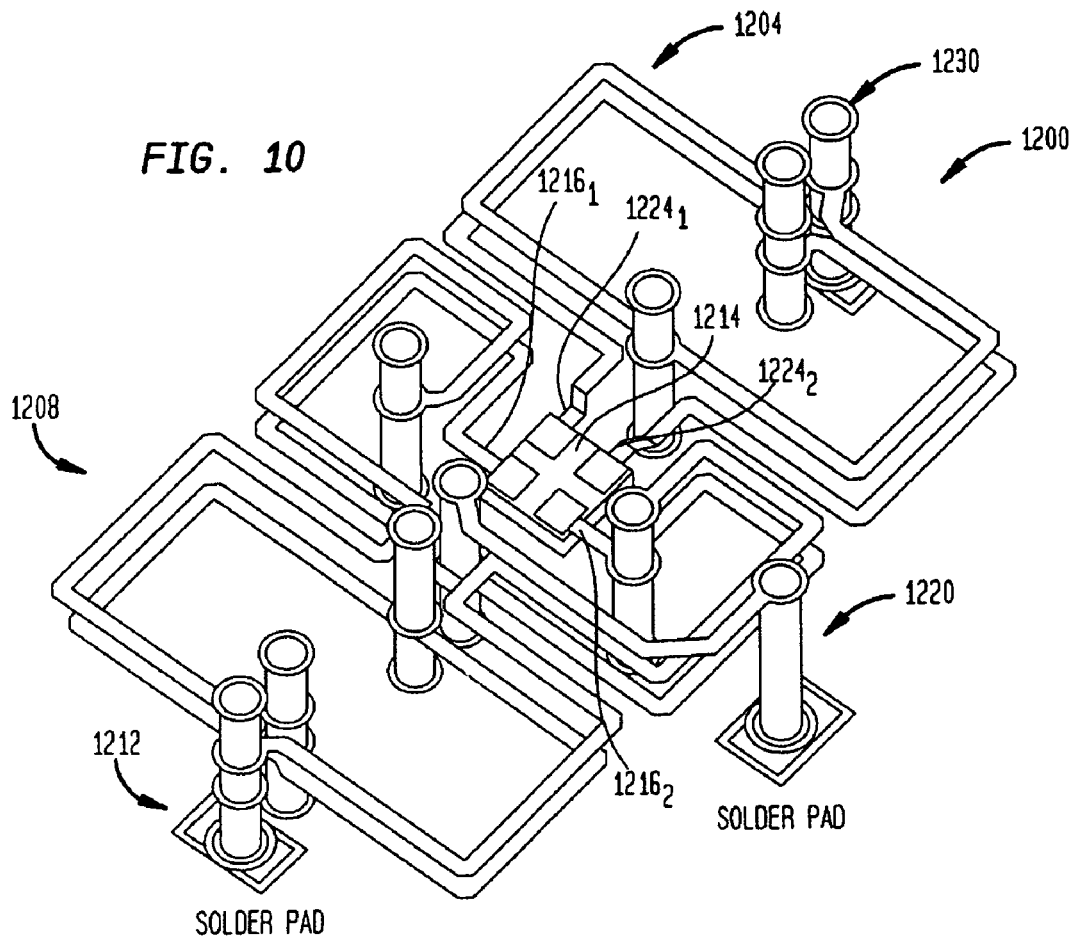
FIG. 10 illustratively depicts a perspective view of a double balanced diode mixer layout in accordance with an aspect of the present invention.

FIG. 9 illustratively depicts a schematic circuit diagram of a double balanced diode mixer 1100. In accordance with an aspect of the present invention, the mixer 1100 may be implemented and laid out on a printed circuit board as shown in FIG. 10. The mixer layout 1200 of FIG. 10 includes a pair of balun transformers 1204, 1208 implemented in accordance with the foregoing aspects of the present invention. In particular, each of these transformers 1204, 1208 comprise pairs of C-shaped broadside vertically coupled transmission lines. More particularly, a local oscillator signal is applied to the unbalanced LO port 1212. The local oscillator signal is then coupled by the transformer 1208 to the diode ring 1214 via the differential or balanced ports $1216_1$, $1216_2$. An intermediate frequency signal appearing on the IF port 1220 is also coupled to the diode ring 1214 at the balanced ports $1216_1$ and $1216_2$.

The balanced ports $1224_1$, $1224_2$ of the other transformer 1204 couple the mixed signals to the unbalanced RF port 1230 of the transformer 1204. It should be recognized that a mixer implemented in accordance with the circuitry 1200 may function to either mix up or mix down a signal. That is, it may comprise a circuit that mixes the local oscillator signal with the intermediate frequency signal to produce a higher frequency RF signal. On the other hand, it may comprise a signal that mixes the local oscillator signal with the RF signal to produce an intermediate frequency signal.

Figure 11:
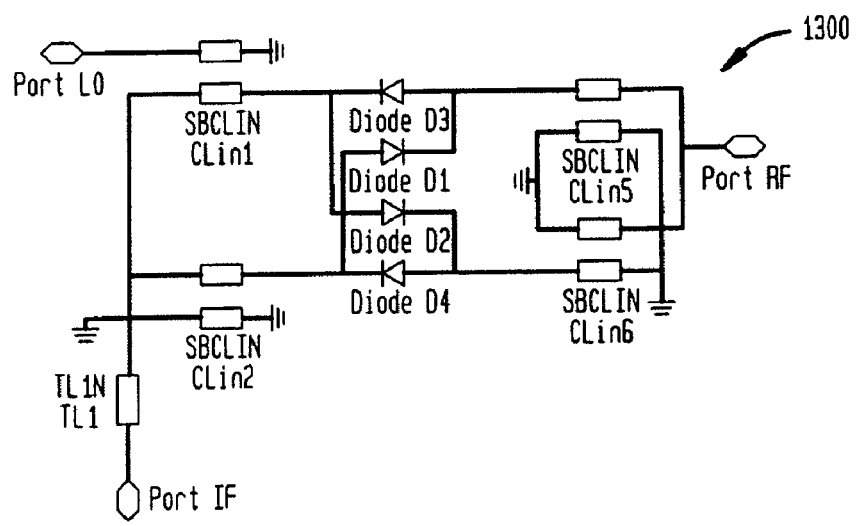
FIG. 11 illustratively depicts a schematic circuit diagram of a double balanced mixer in accordance with an aspect of the present invention.
Figure 12:
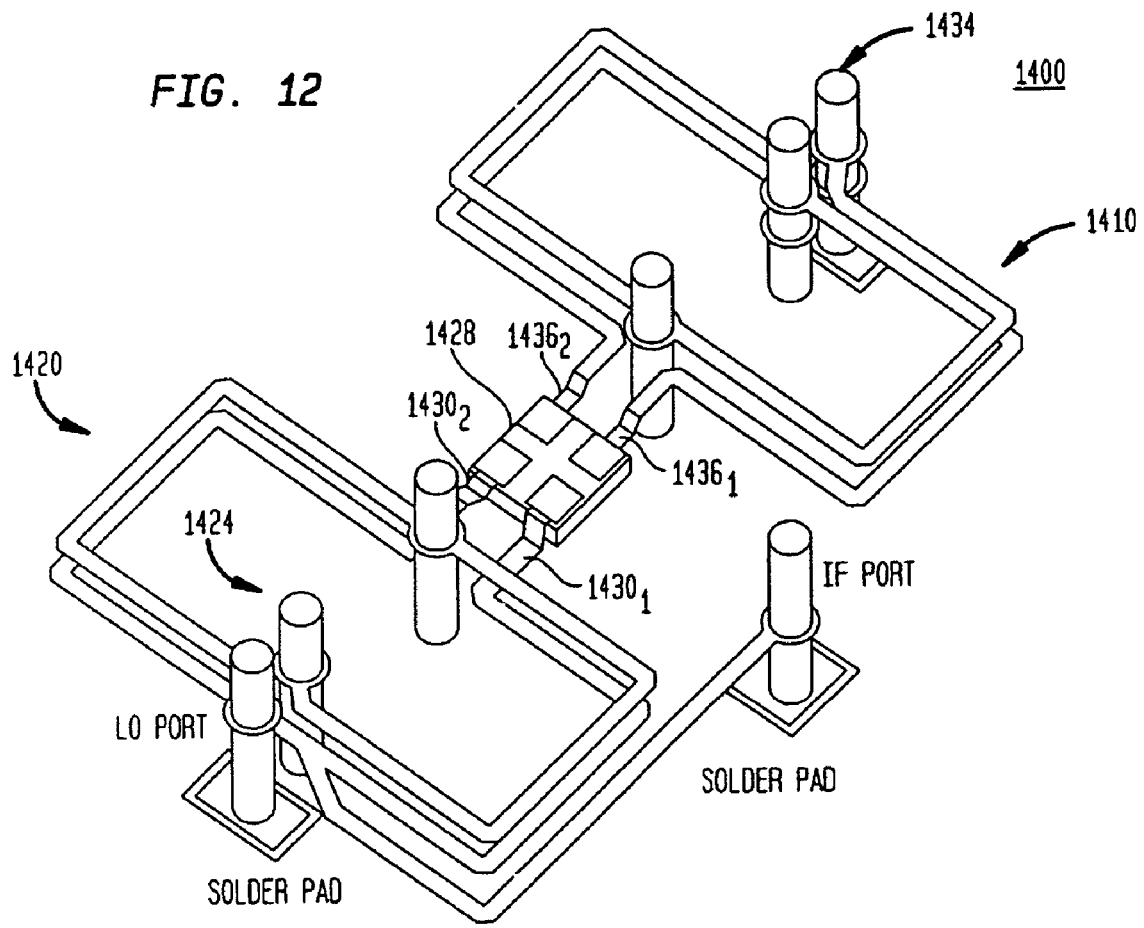
FIG. 12 illustratively depicts a perspective view of a double balanced mixer layout in accordance with an aspect of the present invention.

FIG. 11 shows a double balanced mixer 1300 that is laid out in accordance with the surface mountable balun transformers shown in FIG. 12. As shown, the mixer 1400 of FIG. 12 includes two balun transformers 1410, 1420. Balun transformer 1410 comprises the layout shown and discussed above in relation to FIG. 3. Transformer 1420 comprises the hybrid layout discussed and shown in FIG. 8. As shown, the hybrid layout 1420 allows the intermediate frequency signal to be more conveniently coupled and mixed with the signal at the local oscillator port. In that regard, both the signals are coupled to the unbalanced port 1424. Those signals are then provided to the diode ring 1428 via the balanced ports $1430_1$ and $1430_2$. The RF signal from the diode ring 1428 is coupled to the unbalanced port 1434 of the transformer 1410 via the balanced ports $1436_1$ and $1436_2$. Thus, the hybrid transformer 1420 allows for a less complicated layout. In addition, by reversing the mixing order and placing the hybrid so that it couples the RF signal and local oscillator to the mixer or diode ring 1428, the mixer may operate as a down converter.

Figure 13:
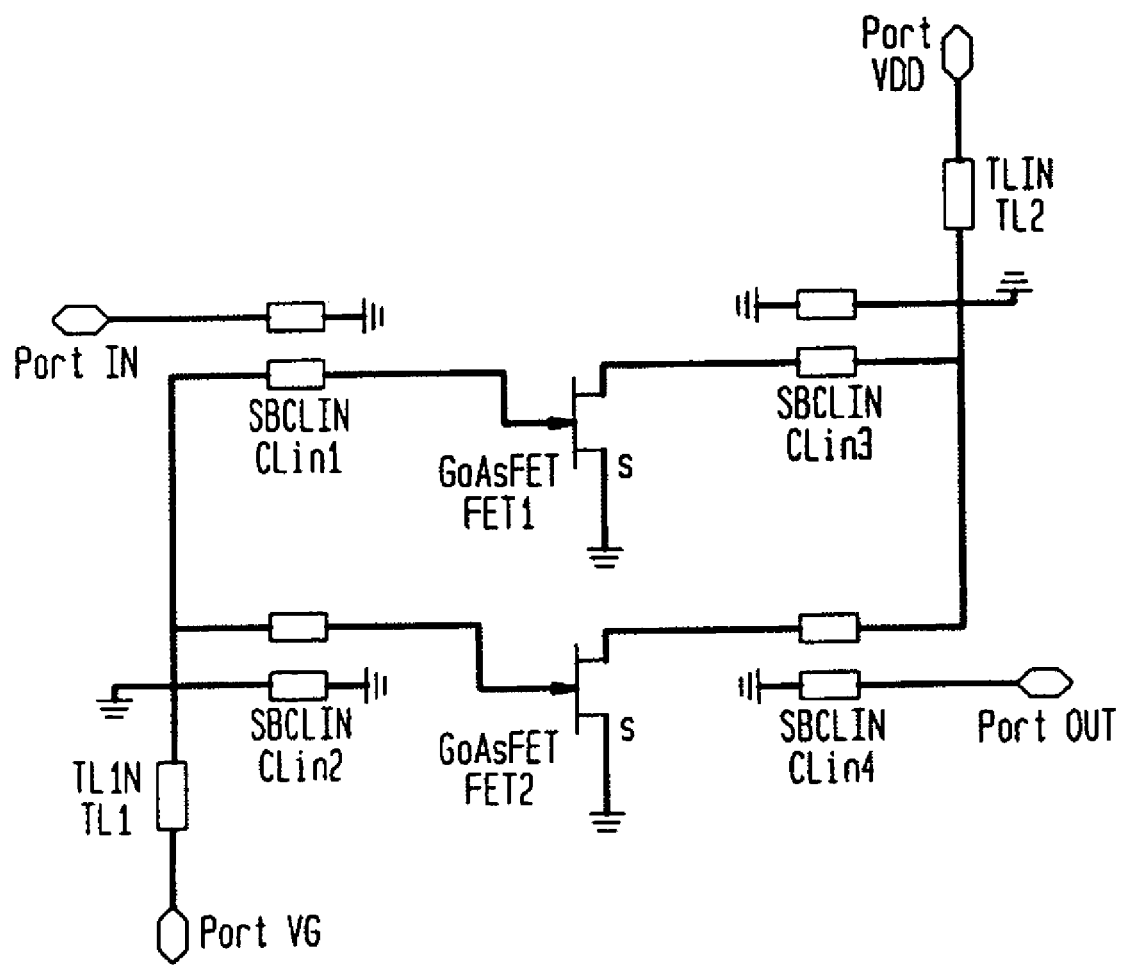
FIG. 13 illustratively depicts a schematic circuit diagram of a push-pull amplifier in accordance with an aspect of the present invention.
Figure 14:
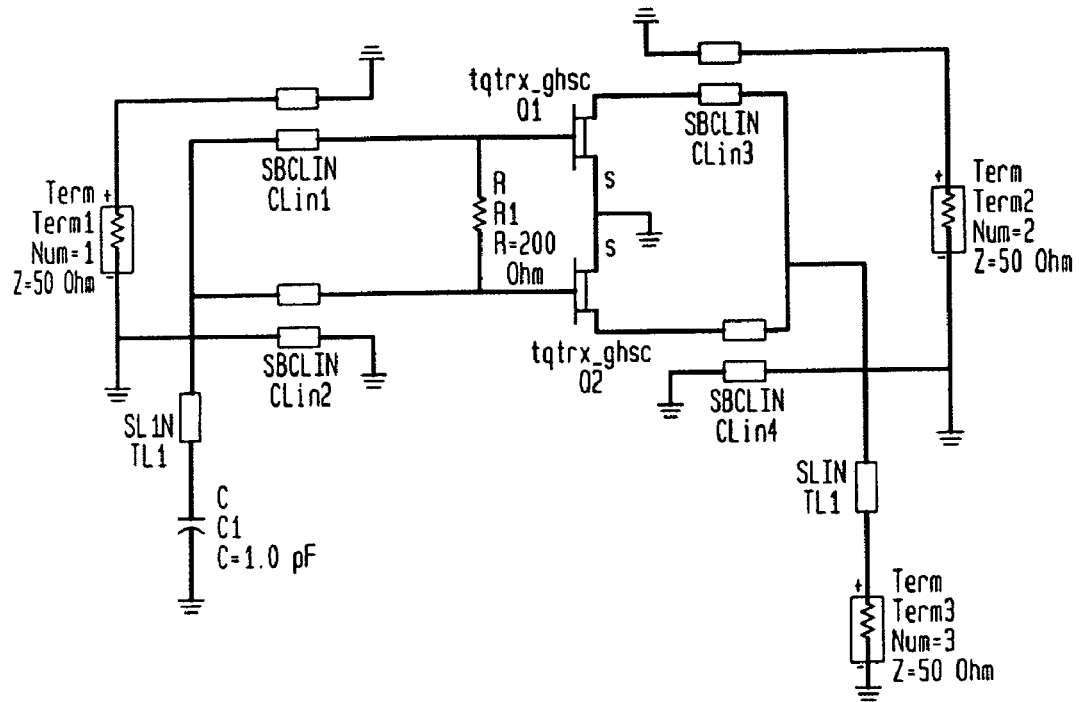
FIG. 14 illustratively depicts a reflective mixer in accordance with an aspect of the present invention.
Figure 15:
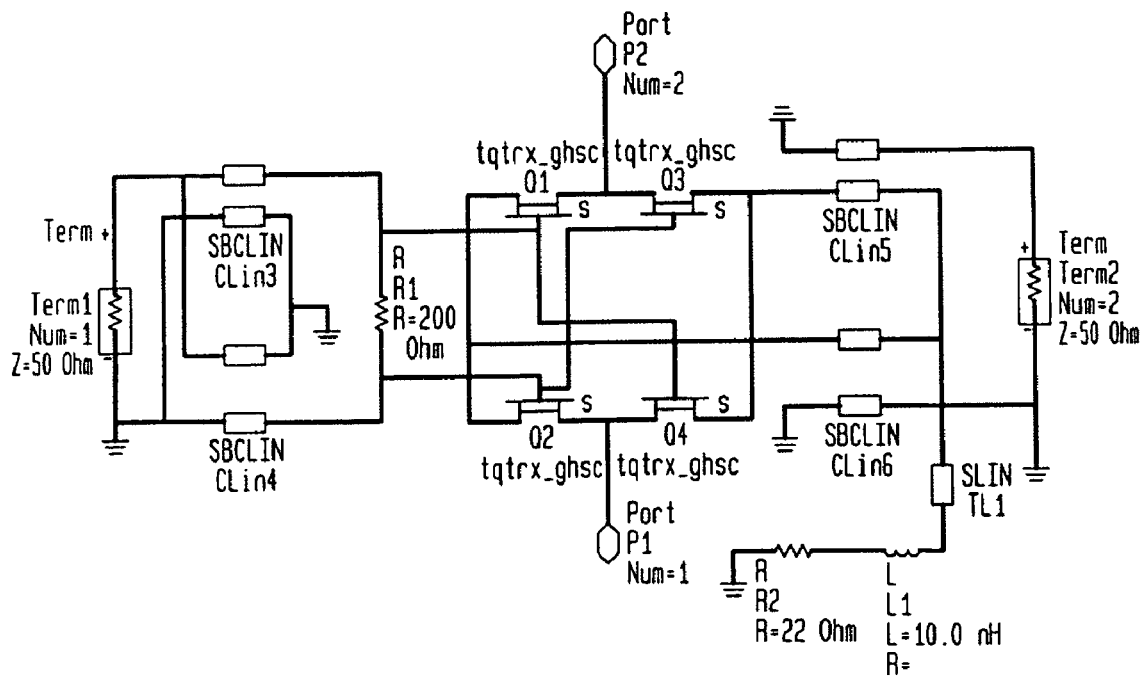
FIG. 15 illustratively depicts double balanced FET mixer in accordance with an aspect of the present invention.

FIGS. 13, 14 and 15 illustratively depicts equivalent circuits of other electronic devices that may be implemented using the layouts shown and discussed above in accordance with further aspects of the present invention. FIG. 13 illustratively depicts an equivalent circuit of the push-pull amplifier. FIG. 14 illustratively depicts an equivalent circuit of a reflective FET mixer and FIG. 15 illustratively depicts the equivalent circuit of double balanced FET mixer in accordance with additional aspects of the present invention. Each of these devices or electronic circuits may be advantageously implemented using the transformer layouts described above. By using our transformers in these circuits, the frequency bandwidth is advantageously extended while maintaining low loss performance. In addition, circuits implemented using the transformers disclosed herein reduce (and in some cases prevent) resonance from occurring within the desired bandwidth and provides stable impedance. Furthermore, such circuits will also advantageously exhibit good phase/amplitude matching.

Figure 16:
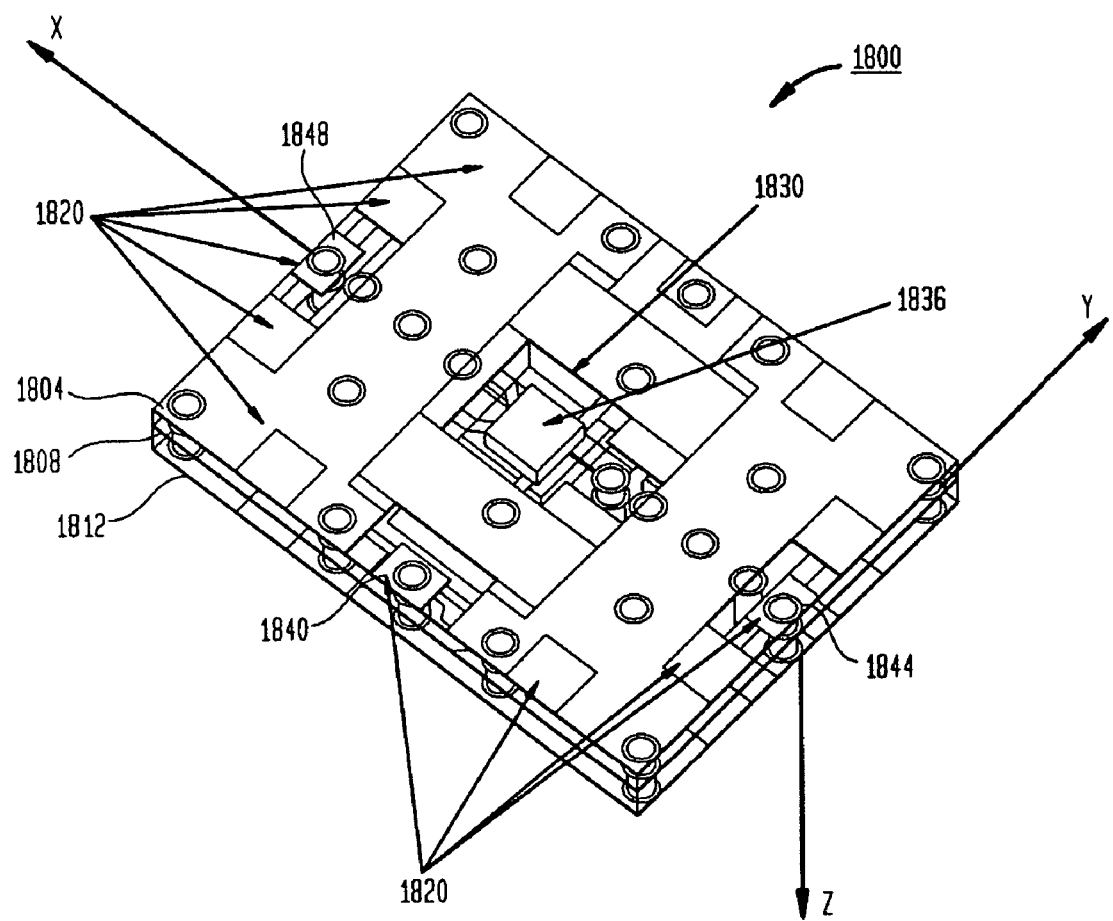
FIG. 16 illustratively depicts a perspective view of a layout of a multi-layer planar circuit board in accordance with an aspect of the present invention.

Turning now to FIG. 16, there shown a multilayer printed circuit board 1800 implemented in accordance with an aspect of the present invention. This board includes three layers 1804, 1808 and 1812. Each of these layers comprises a planar surface, each surface extending along the x and y axes as shown. Each of the surfaces also extends parallel to each other and are disposed relative to each other along the z axis. As shown, the board includes a number of solder pads 1820 and a cavity 1830. A diode ring 1836 is placed in the cavity 1830. The diode ring is then connected to the transformer baluns as discussed above with respect to FIG. 10 or 14. In particular, the IF port may be formed at solder pad 1840. The RF and IF ports may be formed at solder pads 1844 and 1848, or vice versa.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

The invention claimed is:

1. A surface mountable balun transformer for integration into a printed circuit board, comprising:
   a first C-shaped line segment having a first end and a second end disposed on a layer of the printed circuit board; and
   a second C-shaped line segment having a first end and a second end disposed on the layer of the printed circuit board, and
   a third C-shaped line segment broadside vertically coupled to the first C-shaped line element, and
   a fourth C-shaped line segment broadside vertically coupled to the second C-shaped line element,
   wherein the first ends of the first and second C-shaped line segments provide a balanced port for connecting to the transformer and the second end of the first C-shaped line segment provides an unbalanced port for connecting to the transformer.

2. The surface mountable balun transformer of claim 1, wherein the third and fourth C-shaped line segments are separated from the first and second C-shaped line segments by a dielectric material.

3. The surface mountable balun transformer of claim 1, wherein the third and fourth C-shaped line segments are broadside vertically partially respectively coupled to the first and second C-shaped line segments.

4. The surface mountable balun transformer of claim 1, wherein the balanced port is disposed opposite the unbalanced port on the layer of the printed circuit board.

5. A surface mountable balun transformer for integration into a printed circuit board, comprising:
   a first C-shaped line segment having a first end and a second end disposed on a layer of the printed circuit board;
   a second C-shaped line segment having a first end and a second end disposed on the layer of the printed circuit board; and
   a first port formed by a metallized via hole that couples the balun transformer to the power plane of the printed circuit board,
   wherein the first ends of each of the C-shaped line segments provide a balanced port for connecting to the transformer and the second end of the first C-shaped line segment provides an unbalanced port for connecting to the transformer.

6. The surface mountable balun transformer of claim 5, further comprising a second port formed by a metallized via hole that is located adjacent to the first ends of the C-shaped segments.

7. The surface mountable balun transformer of claim 5, wherein each of the C-shaped line segments are folded to form a pair of U-shaped sections that are connected in series.

8. A surface mountable balun transformer for integration into a printed circuit board, comprising:
   a first C-shaped line segment having a first end and a second end disposed on a layer of the printed circuit board;
   a second C-shaped line segment having a first end and a second end disposed on the layer of the printed circuit board, wherein the first ends of each of the C-shaped line segments provide a balanced port for connecting to the transformer and the second end of the first C-shaped line segment provides an unbalanced port for connecting to the transformer; and
   a first port formed by a metallized via that extends between the layers of the printed circuit board and wherein the first port is located adjacent the balanced port and connected to the second end of the second line segment and is shorted to a ground through the metallized via.

9. A printed circuit board, comprising:
   a first planar layer and a second planar layer disposed opposite and parallel to the first planar layer;
   a first C-shaped line segment having a first end and a second end disposed on the first planar layer of the printed circuit board;
   a second C-shaped line segment broadside vertically coupled to the first C-shaped line segment, the second C-shaped line segment having a first end and a second end disposed on the second planar layer of the printed circuit board;
   a third C-shaped line segment having a first end and a second end disposed on the first planar layer of the printed circuit board;
   a fourth C-shaped line segment broadside vertically coupled to the third C-shaped line segment, the fourth C-shaped line segment having a first end and a second end disposed on the second planar layer of the printed circuit board; and
   a fifth line segment have an end connecting the second ends of the first and third line segments and another end forming an unbalanced port, and
   wherein the first ends of the first and third line segments form a balanced port and first end of the second line segment forms an unbalanced port.

10. The printed circuit board of claim 9, wherein each of the C-shaped line segments are folded to form a pair of U-shaped sections that are connected in series.

11. The printed circuit board of claim 9, wherein the second end of the second line segment is connected to ground on the second layer of the board through a metallized via.

12. A printed circuit board, comprising:
   a first planar layer and a second planar layer disposed opposite and parallel to the first planar layer;
   an electronic circuit disposed within a cavity formed within the first planar layer;
   a first balun transformer having a pair of C-shaped broadside vertically coupled lines connected in series so as to form a first unbalanced port on the first planar layer and a first balanced port on the first planar layer opposite the unbalanced port;
   a second balun transformer having a pair of C-shaped broadside vertically coupled lines connected in series so as to form a second unbalanced port on the first planar layer and a second balanced port on the first planar layer opposite the second unbalanced port; and wherein the first and second balanced ports are connected the electronic circuit.

13. The printed circuit board of claim 12, wherein the electronic circuit comprises a device selected from the group consisting of a diode ring, mixer and amplifier.

14. The printed circuit board of claim 13, wherein the first balanced port is connectable to a local oscillator signal that is coupled to the diode ring by the first unbalanced port.

15. The printed circuit board of claim 14, wherein the second unbalanced port couples a radio frequency signal from the diode ring to the second balanced port.

* * * * *